(12) United States Patent
Zhang et al.

(10) Patent No.: US 7,948,771 B2
(45) Date of Patent: May 24, 2011

(54) ELECTRICAL COMPONENT AND METHOD FOR MAKING THE SAME

(75) Inventors: Hong-Bo Zhang, Kunshan (CN); Zheng-Hua Xu, Kunshan (CN); Chao-Dong Huang, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 404 days.

(21) Appl. No.: 12/077,761

(22) Filed: Mar. 21, 2008

(65) Prior Publication Data

US 2008/0232078 A1    Sep. 25, 2008

(30) Foreign Application Priority Data

Mar. 21, 2007   (CN) .......................... 2007 1 0020750

(51) Int. Cl.
*H05K 7/02* (2006.01)
(52) U.S. Cl. ........................................ 361/809; 361/836
(58) Field of Classification Search .................. 361/809, 361/836, 752, 807; 174/52.4, 52.3; 29/592.1; 439/620.21–620.23

See application file for complete search history.

(56) References Cited

U.S. PATENT DOCUMENTS

| | | | |
|---|---|---|---|
| 5,656,985 A | 8/1997 | Lu et al. | |
| 6,225,560 B1 * | 5/2001 | Machado | 174/556 |
| 6,305,950 B1 * | 10/2001 | Doorhy | 439/76.1 |
| 6,691,398 B2 * | 2/2004 | Gutierrez | 29/592.1 |
| 6,912,781 B2 * | 7/2005 | Morrison et al. | 29/854 |
| 7,326,084 B1 * | 2/2008 | Chen et al. | 439/620.23 |

FOREIGN PATENT DOCUMENTS

CN        2505964 Y        8/2002

* cited by examiner

*Primary Examiner* — Jinhee J Lee
*Assistant Examiner* — Yuriy Semenenko
(74) *Attorney, Agent, or Firm* — Ming Chieh Chang; Wei Te Chung; Andrew C. Cheng

(57) ABSTRACT

An electrical component (100) includes a housing (1), a number of terminals (2) molded within housing and at least one electrical element (3). The housing has at least a side wall (11) having a number of recesses (112) and an internal cavity (15). Each terminal has a first end (23) extending to a bottom of the side wall and formed with a platform portion (231) located onto the bottom of the side wall and aligned with the corresponding recess. The electrical element has a number of wires (321) wrapped thereon. One end of the wire extends outward the cavity through the recess and is soldered onto the corresponding platform portion.

11 Claims, 5 Drawing Sheets

ELECTRICAL COMPONENT AND METHOD FOR MAKING THE SAME

BACKGROUND OF THE INVENTION

1. Field of the Invention

The present invention relates to an electrical component having a plurality of electrical elements adapted for being soldered onto a plurality of terminals and a method for producing the same.

2. Description of Prior Arts

U.S. Pat. No. 5,656,985 issued on Aug. 12, 1997 discloses an electronic component comprising a housing having a plurality of side walls, an open bottom and a cavity defined therebetween, a plurality of electrical elements located within the cavity and a plurality of pins molded into the side walls of the housing. The electrical element has a plurality of wires wrapped thereon. Each of the pins has a notched post upon which the wire is wound.

However, during assembling, it is difficult and time consuming to wind the wire upon the notched post.

Hence, it is desirable to provide an improved electrical element to overcome the aforementioned disadvantages.

SUMMARY OF THE INVENTION

An object of the present invention is to provide an electrical component comprising a number of terminals and at least an electrical element having a plurality of wires effectively connected with the corresponding terminals. Another object of the present invention is to provide a method of easily assembly the electrical component.

To achieve the above object, an electrical component comprises a housing, a plurality of terminals embedded within housing and at least one electrical element. The housing has a top wall, at least a side wall having a plurality of recesses, an open bottom and an internal cavity. Each terminal has a first end extend to a bottom of the side wall and formed with a platform portion located onto the bottom of the side wall and aligned with corresponding recess. The electrical element comprises a plurality of wires wrapped thereon. One end of the wire extends through the recess and is soldered onto the corresponding platform portion.

During assembly, it is easy to solder the wires of electrical element onto the terminals if only locating the ends of the wires on the corresponding platform portions of the terminals.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
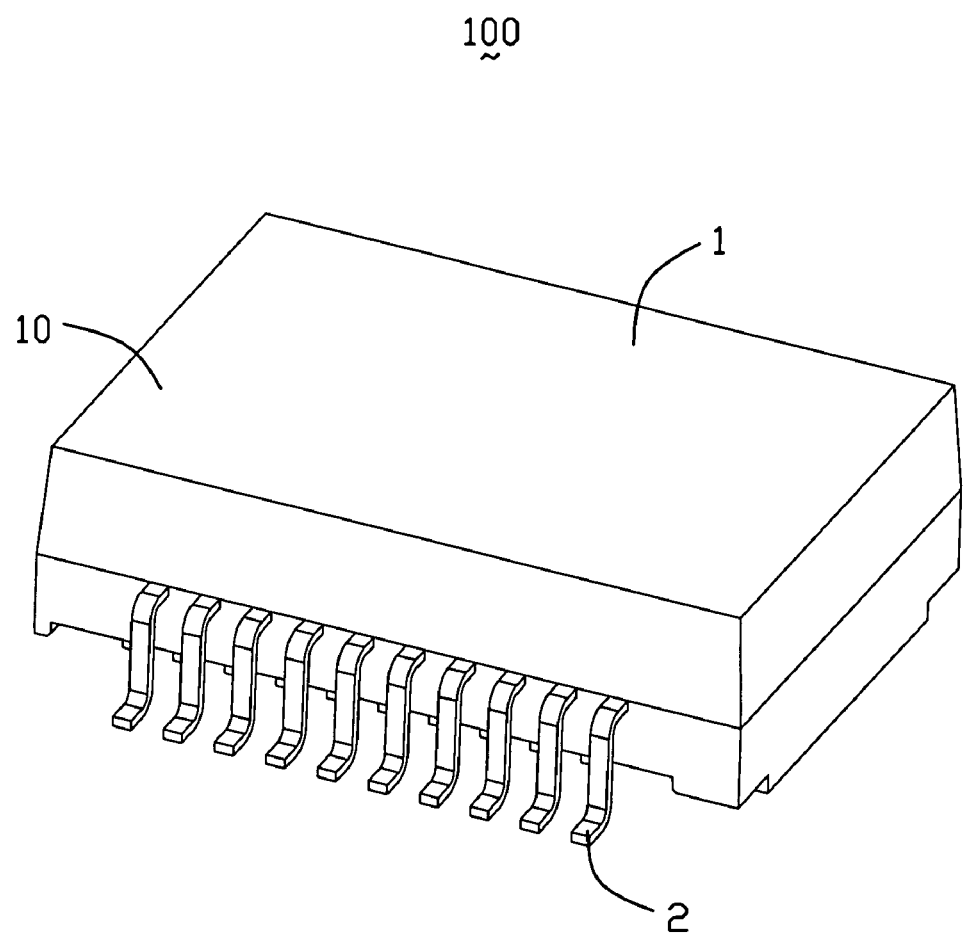
FIG. 1 is a perspective view of an electrical component in accordance with the present invention.

Reference will now be made to the drawing figures to describe the present invention in detail. Referring to FIGS. 1-5, an electrical component 100 in accordance with the present invention comprises a housing 1, a plurality of terminals 2 embedded within the housing 1 and a number of electrical elements 3. Each electrical element 3 has a plurality of wires 32 wrapped thereon.

Figure 2:
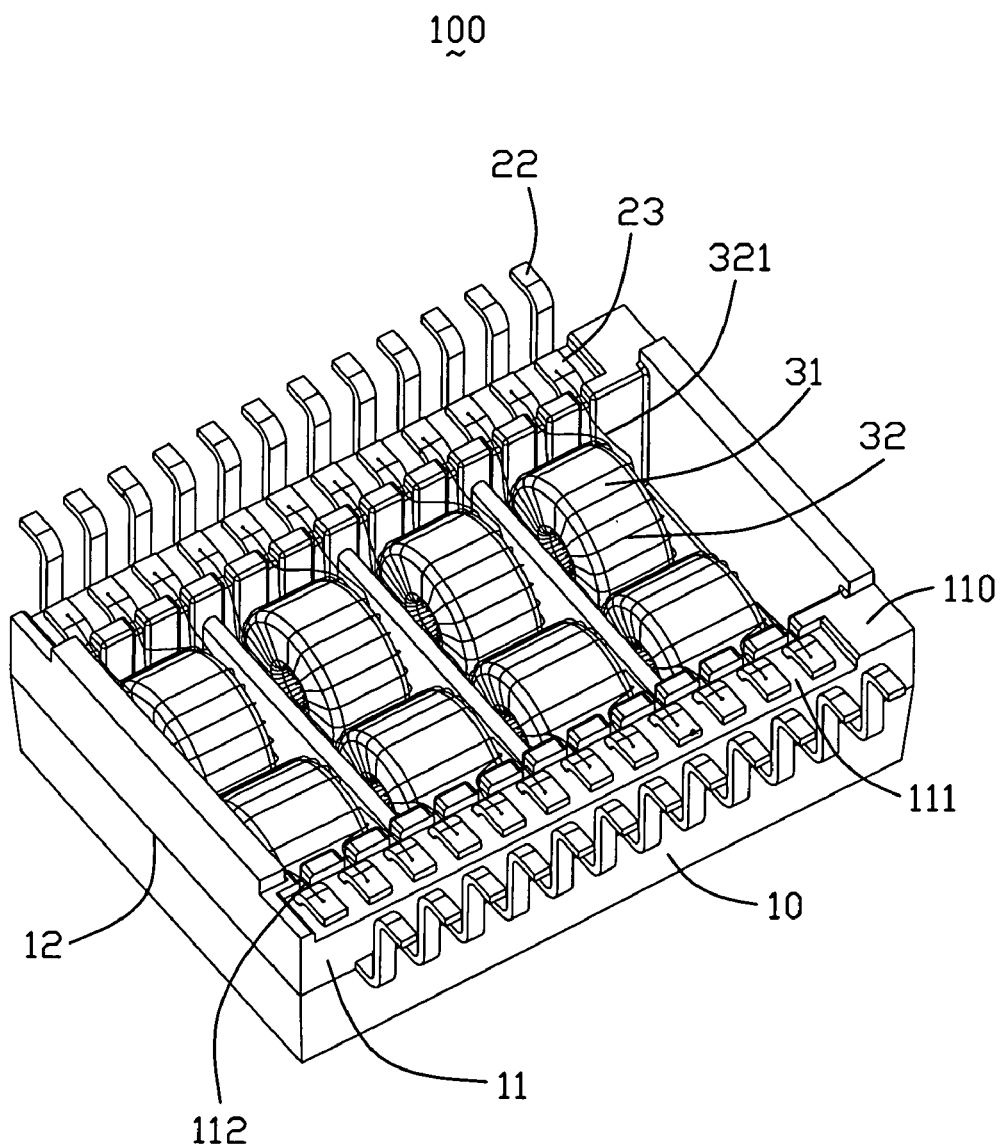
FIG. 2 is perspective view of the electrical component, taken from another aspect.
Figure 3:
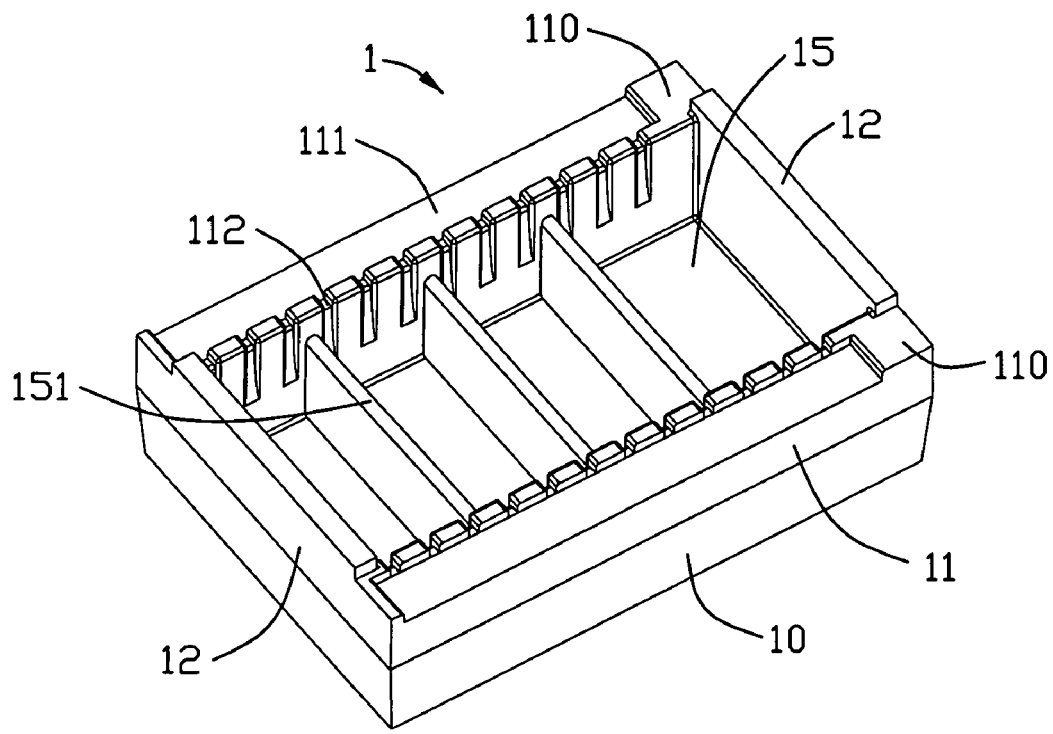
FIG. 3 is a perspective view showing a housing of the electrical component.

Referring to FIGS. 2 and 3, the housing 1 has a top wall 10, a pair of opposite side walls 11, 12, an open bottom (not labeled), a plurality of internal walls 151 forming a number of divided internal cavities 15 for receiving the electrical elements 3. A bottom surface 110 of the side wall 11 is provided with a depressed portion 111 and has a plurality of recesses 112 defined thereon.

Figure 4:
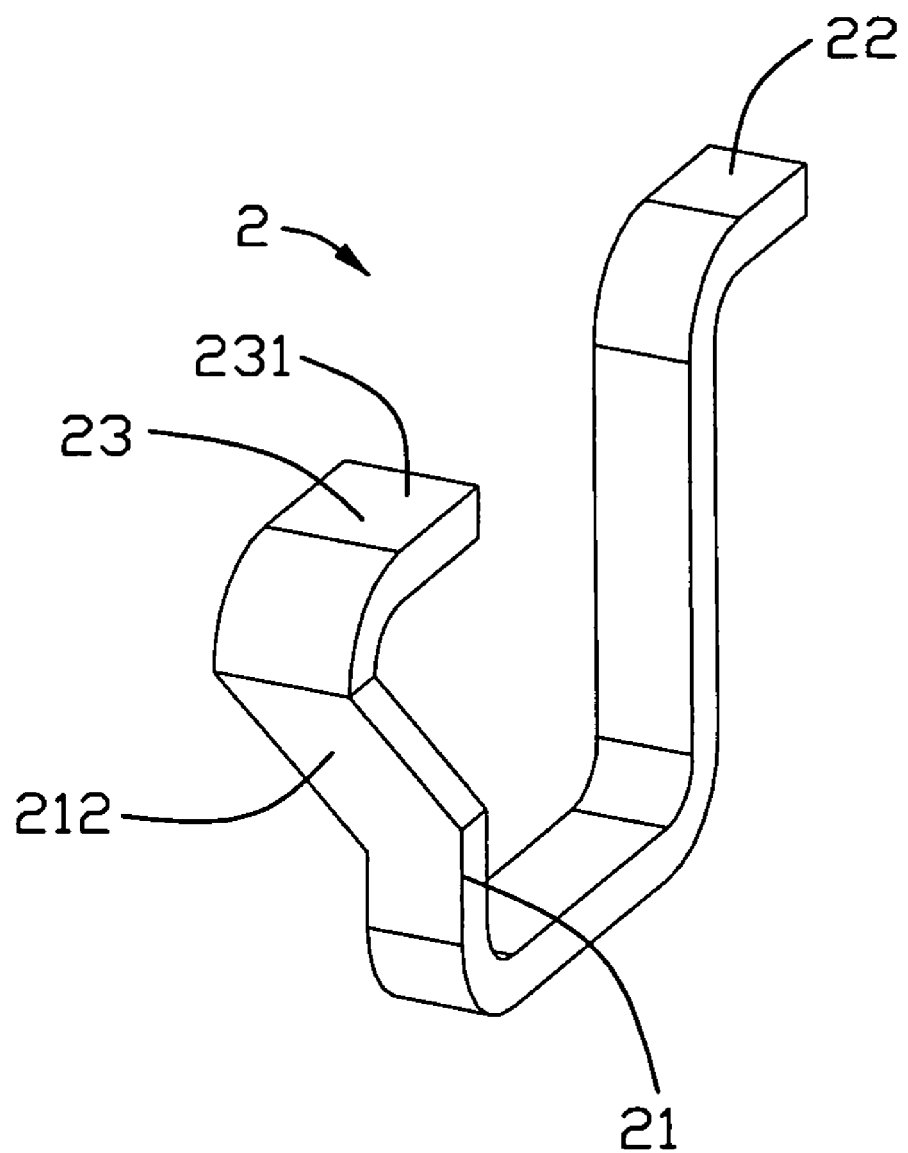
FIG. 4 is a perspective view showing a terminal of the electrical component.
Figure 5:
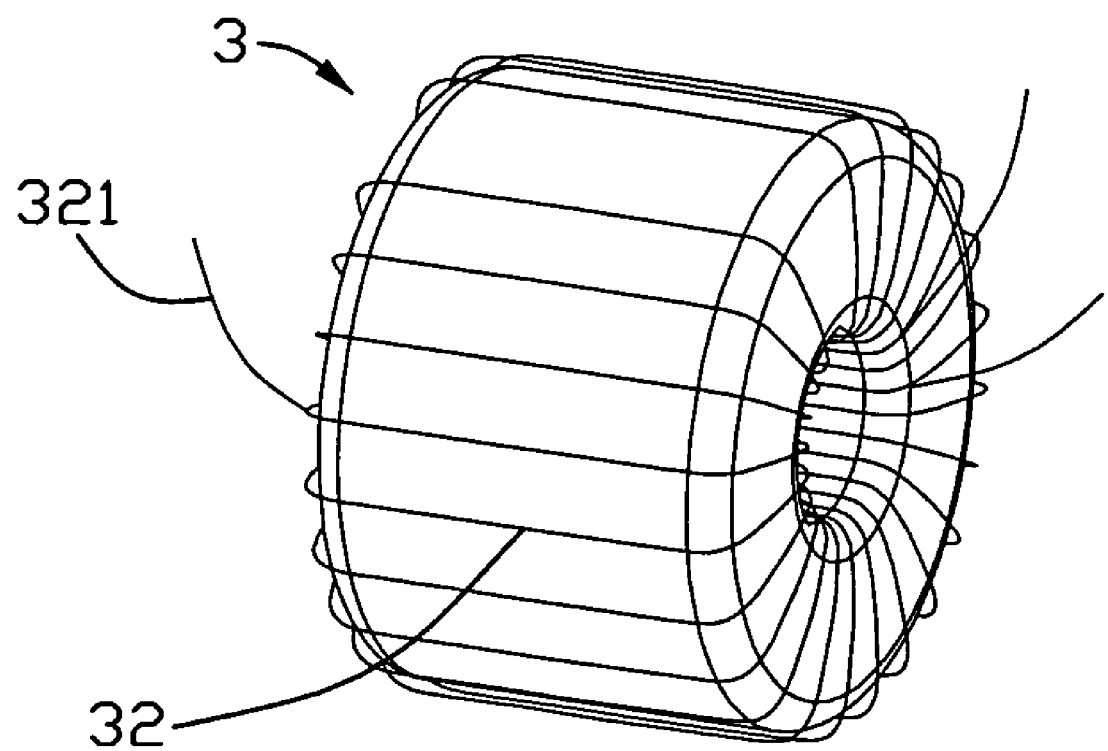
FIG. 5 is a perspective view showing an electrical element of the electrical component.

Referring to FIGS. 2 and 4, the terminals 2 are molded within the side walls 11 and each terminal 2 has a first end 23 extending along a bottom of said side walls 11, a second end 22 extending outwardly form the side wall 11 and a holding portion 21 molded within the housing 1. The holding portion 21 has a bending portion 212 extending obliquely upwardly. The first end 23 bends from the bending portion 212 and forms a platform portion 231 located on the depressed portion 111 of the side wall 11 and aligned with corresponding recess 112. The width of the platform portion 231 of the first end 23 is greater than the width of the second end 22 and the holding portion 21. The platform portion 231 of the first end 23 is not in alignment with the second end 22.

Referring to FIGS. 1-5, in assembling the electrical component 100, firstly, the terminals 2 are assembled to the side wall 11 of housing 1 by insert molding. Secondly, said electrical elements 3 are mounted within said internal cavities 15 of housing 1. Thirdly, one end of wire 321 is routed through the recess 111 of the side wall 11 and located onto the platform portion 231 of the terminal 2. Finally, the ends 321 of the wires 32 are soldered to the platform portions 231 of the terminals 2.

In accordance with the present invention, the electrical elements 3 are magnetic cores. Understandably, the electrical element 3 could be made from other material.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical component comprising:
   a housing comprising a top wall, side walls having a plurality of recesses, an open bottom, and an internal cavity;
   a plurality of terminals embedded in the side wall, each terminal having a first end extending to a bottom of said side wall and formed with a platform portion lied on the bottom of the side wall and aligned with a corresponding recess, and an opposite second end extending outwardly from the housing for soldering, said platform portion and said second end of each terminal orienting toward a same direction; and
   at least one electrical element positioned within the cavity and having a plurality of wires wrapped thereon, one end of the wire extending outward the cavity through the recess and soldered onto the corresponding platform portion.

2. The component as claimed in claim 1, wherein said terminal has a holding portion having an embedding portion embedded within the side wall and extending through the side wall along a transverse direction.

3. The electrical component as claimed in claim 2, wherein said holding portion has a bending portion between the embedding portion of the holding portion and the platform portion, said bending portion extending obliquely upwardly.

4. The electrical component as claimed in claim 2, wherein said platform portion of the first end has a width greater than the width of the second end and the holding portion.

5. The electrical component as claimed in claim 1, wherein said side wall has a bottom surface defining a depressed portion, said platform portions are positioned onto the depressed portion.

6. The electrical component as claimed in claim 1, wherein said electrical element is a magnetic core.

7. The electrical component as claimed in claim 1, wherein said housing has a plurality of internal walls for forming a plurality of divided internal cavities for receiving a plurality of electrical elements.

8. A method for manufacturing an electrical component comprising:
   providing at least one electrical element comprising a plurality of wires wrapped thereon;
   forming a housing comprising a top wall, at least one side wall having a plurality of recesses formed on a bottom edge portion thereof, an open bottom, and an internal cavity defined therebetween for receiving the electrical element;
   insert molding a plurality of terminals into the at least one side wall of the housing, each terminal having a first end extending to a bottom of said side wall and formed with a platform portion located on the bottom of the side wall, and an opposite second end for soldering, said platform portion and the second end orienting toward a same direction;
   disposing said electrical element within said internal cavity of the housing;
   routing an end of the wire through the recess of the at least one side wall onto the corresponding platform portion of the terminal; and
   soldering the end of the wire to the platform portion of the terminal.

9. An electronic device comprising:
   an insulative housing defining an internal cavity surrounded by four side walls;
   two rows of terminals disposed along two opposite side walls of said four side walls in a row direction, each of said terminals including an exterior leg extending outwardly beyond the lateral exterior face of the corresponding side wall and exposed to an exterior, and an interior leg seated on an intermediate face of the corresponding side wall which is essentially between the said exterior and said internal cavity, each of said terminal has a holding portion having an embedding portion embedded within the side wall; and
   a plurality of magnetic coils disposed in the internal cavity, each of said magnetic coils being equipped with thereon at least one wire mechanically and electrically connected to the interior leg of the corresponding terminal transversely neighboring thereto; wherein
   each of said magnetic coils defines a center axis extending along said row direction;
   wherein said interior leg and said exterior leg are oriented laterally toward a same direction outwardly.

10. The electronic device as claimed in claim 9, wherein said magnetic coils are arranged in two rows along said row direction, and each row of said magnetic coils is transversely neighboring to the corresponding side wall.

11. The electronic device as claimed in claim 9, wherein the housing defines a depressed portion to receive the corresponding interior legs therein, and a plurality of recesses so as to receive the corresponding wires therein for aligning said wires with the corresponding interior legs, respectively.

* * * * *